United States Patent [19]

Shiotari et al.

[11] Patent Number: 4,459,687
[45] Date of Patent: Jul. 10, 1984

[54] INTEGRATED CIRCUIT HAVING A MULTI-LAYER INTERCONNECTION STRUCTURE

[75] Inventors: Yoshihisa Shiotari; Ichiro Kobayashi, both of Yokohama; Tuneo Nishi, Tokyo, all of Japan

[73] Assignee: Tokyo Shibaura Denki Kabushiki Kaisha, Japan

[21] Appl. No.: 365,009

[22] Filed: Apr. 2, 1982

[30] Foreign Application Priority Data

Apr. 17, 1981 [JP] Japan .................................. 56/57923

[51] Int. Cl.³ .......................................... G11C 11/40
[52] U.S. Cl. ..................................... 365/203; 365/182
[58] Field of Search ....................... 365/174, 182, 203

[56] References Cited

U.S. PATENT DOCUMENTS 4,417,329  11/1983  Mezawa et al. ..................... 365/203

Primary Examiner—Terrell W. Fears
Attorney, Agent, or Firm—Finnegan, Henderson, Farabow, Garrett & Dunner

[57] ABSTRACT

An integrated circuit having a multi-layer interconnection structure comprises a logic section of series-connected MOS FETs each having a gate input connection layer made of a polysilicon layer on a semiconductor substrate of one conductivity type and source and drain semiconductor regions of the other conductivity type formed in the surface of the substrate along such a direction as to traverse the gate input connection layer, a load device connected to one end of the logic section, and interconnection structure for causing a signal, at a junction of the load device and logic the section, to be transmitted to the other end of the logic section across the gate input connection layer.

3 Claims, 9 Drawing Figures

FIG. 1
(PRIOR ART)
FIG. 2
(PRIOR ART)
FIG. 3
(PRIOR ART)
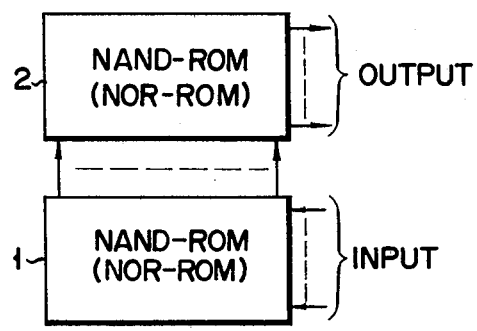
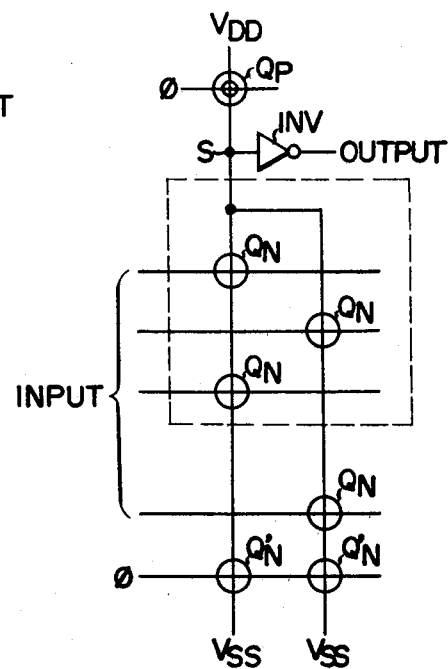
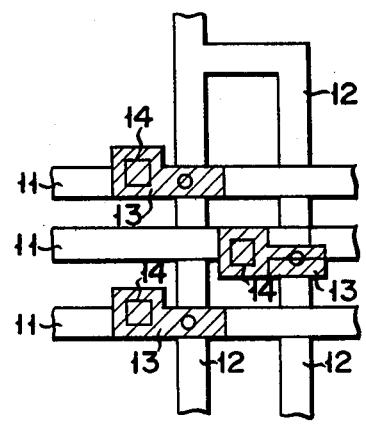

INTEGRATED CIRCUIT HAVING A MULTI-LAYER INTERCONNECTION STRUCTURE

BACKGROUND OF THE INVENTION

This invention relates to an integrated circuit having a multi-layer interconnection structure manufactured using a silicon gate process.

An arithmetic operation processing system such as a microcomputer or an electronic type minicomputer is equipped with a program memory comprised of a ROM (Read Only Memory) or a RAM (Random Access Memory) which is adapted to initially store a program prior to generation of the system. The program is read out of the program memory by the operation of, for example, a key switch. The program then is decoded by an instruction decoder (one type of ROM) to provide various control signals.

FIG. 1 is a block diagram showing an arrangement of the above-mentioned instruction decoder. For a single channel MOS FET the instruction decoder is usually comprised of a two-stage static ROM structure such as a NAND-ROM 1 and NAND-ROM 2, or a NOR-ROM 1 and NOR-ROM 2, as shown in FIG. 1. Now suppose that an arithmetic operation system is to be formed into a C-MOS (Complementary MOS) configuration. In this case, a static structure is difficult to obtain in view of the size of a chip. In the case of the C-MOS configuration, the instruction decoder takes a dynamic type NAND-ROM configuration as shown in FIG. 2. The instruction decoder as shown in FIG. 2 comprises a P-channel MOS FET $Q_P$ adapted to receive a clock pulse $\phi$ at its gate and to precharge a node S, a plurality of series-connected N-channel MOS FETs $Q_N$ adapted to receive an input signal at their gate and forming a NAND logic, a plurality of N-channel MOS FETs $Q'_N$ for discharge control which receive the clock pulse $\phi$ at their gates, and an inverter INV for shaping the waveform of a signal on the node S. With the clock pulse $\phi$ at a low level ($V_{SS}$ level) the MOS FET $Q_P$ is turned ON, causing the node S to become a high level ($V_{DD}$ level). With the clock pulse $\phi$ at a high level the MOS FET $Q_P$ is rendered OFF, causing the MOS FETs $Q'_N$ to be rendered ON. If at this time all the MOS FETs $Q_N$ in one column of a series-connected array are rendered ON, the node S is discharged into a low potential level. Thus, the output of the inverter INV is inverted from a low level to a high level. If, on the other hand, even one of the MOS FETs $Q_N$ in each column is in the nonconductive state, the node S remains at a high level and the output of the inverter INV is kept at a low level.

FIG. 3 is a pattern diagram showing a conventional detailed arrangement of a NAND logic circuit section as enclosed by the broken line shown in FIG. 2. Where, for example, a P-type substrate is used as the semiconductor substrate, the NAND logic circuit section comprises an input connection layer (11, 11, . . . ) formed on the P-type substrate and made of aluminium, an N-type diffusion region 12 formed in the surface of the substrate in a direction perpendicular to the input connection layer 11 and constituting the source and drain regions of the MOS FET and part of another connection layer, and a gate connection layer 13 made of polysilicon. The input connection layer 11 is connected through a contact hole 14 to the gate connection layer 13. In FIG. 3 the MOS FET $Q_N$ is formed in a position where a circular mark is formed.

FIG. 4 is a block diagram showing the FIG. 2 instruction decoder as adopted in a one-chip microcomputer, the instruction decoder including a NAND logic circuit section of the pattern configuration as shown in FIG. 3.

The one-chip microcomputer comprises a RAM 21 for storing various data, instruction ROM 22 disposed adjacent to the RAM 21 to initially store instructions, instruction decoder 23 disposed adjacent to the instruction ROM 22 to decode an instruction supplied from the instruction ROM 22, and a pair of random logic circuits 24 and 25 each disposed on a corresponding side surface of the instruction decoder 23 and adapted to receive a decode output from the instruction decoder 23. A transfer of data is carried out between the random logic circuit 24 and the RAM 21 and an address signal is sent from the random logic circuit 25 to the instruction ROM 22.

In the conventional one-chip microcomputer, since the instruction decoder 23 has its input connection layer 11 made of aluminium as shown in FIG. 3, it is not possible to form another aluminum connection layer traversing the input connection layer 11 to transmit an output signal from the instruction decoder. That is, where an aluminium connection is multi-layered, an insulation layer between the connections must be made much thickness so as to prevent mutual interference of signals transmitted on the respective connections. The instruction decoder is characterized in that it has a greater number of output terminals than the number of input terminals, for example, 100 output terminals are provided with respect to 10 input terminals. For this reason, a longer connection distance is required between the instruction decoder 23 and the random logic circuits 24 and 25 and a broader interconnection area is involved, making the chip size of the microcomputer per se bulkier, causing a longer signal delay time. As a result, the operation speed is slowed down.

SUMMARY OF THE INVENTION

It is accordingly an object of this invention to provide an integrated circuit having a multi-layer interconnection structure which permits the reduction of the size of the chip needed.

It is another object of this invention to provide an integrated circuit having a multi-layer interconnection structure which enables high speed performance of the operation unit. According to one embodiment of this invention there is provided an integrated circuit having a multi-layer interconnection structure, comprising a logic section of series-connected MOS FETs each having a gate input connection layer made of a polysilicon layer on a semiconductor substrate of one conductivity type and source and drain semiconductor regions of the other conductivity type which are formed in the surface of the substrate along such a direction as to traverse the gate input connection layer, a load device connected to one end of the logic section, and interconnection structure for causing a signal at a junction of the load device and logic section to be transmitted to the other end of the logic section across the gate input connection layer.

According to another embodiment of this invention there is provided an integrated circuit having a multi-layer interconnection structure, comprising a ROM for storing an instruction, a logic section of series-connected MOS FETs each having a gate input connection layer made of a polysilicon layer on a semiconductor substrate of one conductivity type and source and drain semiconductor regions of the other conductivity type which are formed in the surface of the substrate along such a direction as to traverse the gate input connection layer, a load device connected to one end of the logic section, an instruction decoder arranged adjacent to the ROM and including interconnection structure for causing a signal at the junction of the load device and logic section to be transmitted to the other end of the logic section across the gate input connection layer and a pair of random logic circuits arranged at, and adjacent to, the corresponding side surface of the instruction decoder and to which an output from the instruction decoder is applied.

BRIEF DESCRIPTION OF THE DRAWINGS

FIG. 1 is a block diagram showing prior art instruction decoder constructed of single-channel MOS FETs;

FIG. 2 is a circuit diagram showing prior art an instruction decoder of C-MOS structure;

FIG. 3 is a pattern diagram showing a conventional detailed arrangement of NAND logic circuit section as enclosed by the broken line in FIG. 2;

DETAILED DESCRIPTION OF THE PREFERRED EMBODIMENTS

Figure 5:
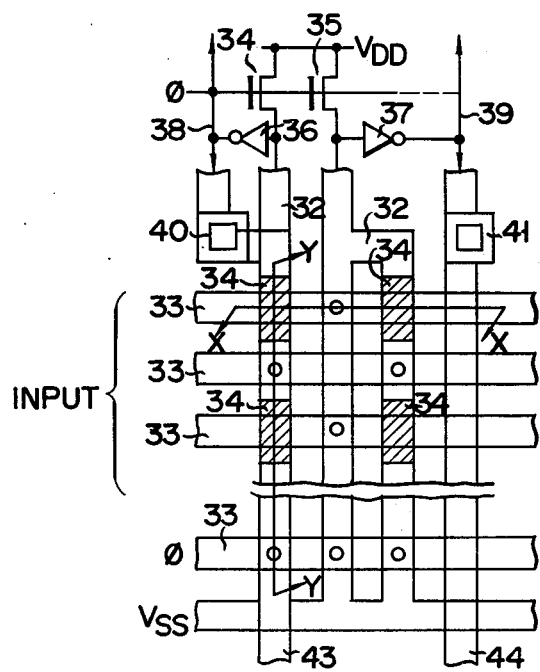
FIG. 5 is a pattern diagram of an integrated circuit having a multi-layer interconnection structure according to one embodiment of the present invention.
Figure 6A:
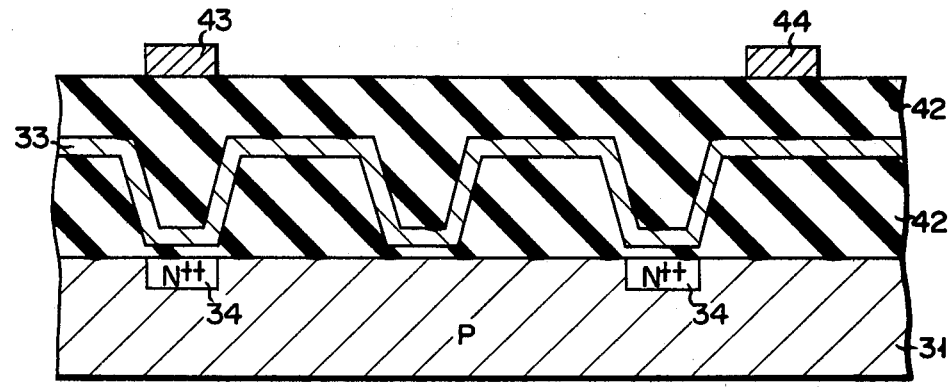
FIG. 6A is a cross-sectional view as taken along the line X—X in FIG. 5.
Figure 6B:
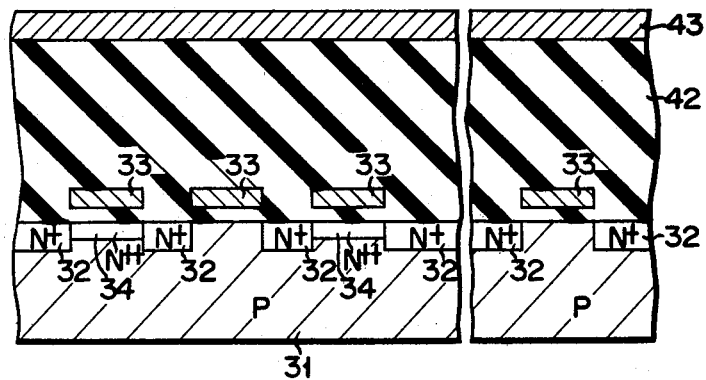
FIG. 6B is a cross-sectional view as taken along line Y—Y in FIG. 5.
Figure 7:
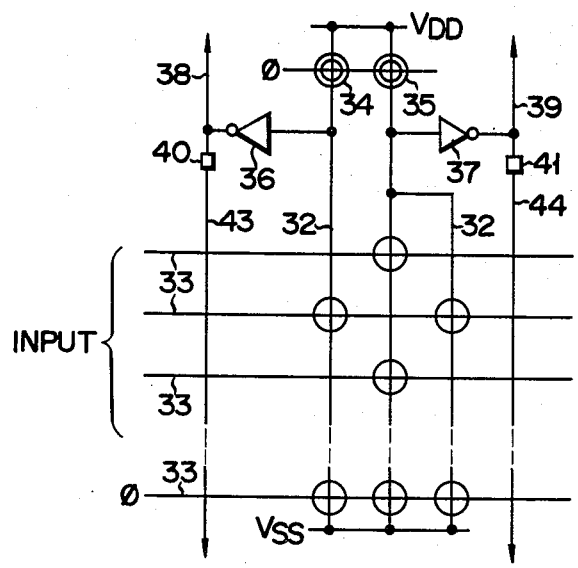
FIG. 7 is an equivalent circuit diagram of the circuit as shown in FIG. 5.

FIG. 5 is a pattern diagram showing an integrated circuit of a multi-layer interconnection structure according to one embodiment of this invention, as applied to an instruction decoder of C-MOS structure. FIGS. 6A and 6B show cross-sectional views as taken along the line X—X and Y—Y, respectively, in FIG. 5. In the circuit of this embodiment, the functions of the input connection layer 11, gate connection layer 13 and contact hole 14 in the FIG. 2 circuit are performed by a gate input connection layer 33 (FIGS. 6A and 6B) made of a polysilicon layer, permitting the formation of a metallic connection layer traversing the gate input connection layer 33 (FIGS. 6A and 6B). That is, this circuit includes an N-type diffusion region 32 arranged in a predetermined direction in the surface of, for example, a P-type substrate 31 and forming source and drain regions of a MOS FET and part of a connection layer. A gate input connection layer 33 made of a polysilicon layer is formed in a direction perpendicular to that in which the diffusion region 32 is arranged. N-channel MOS FETs are formed on those locations each marked as a circle which are located on those intersections of the gate input connection layer 33 and extension of the diffusion region 32. At each of those unmarked locations corresponding to the intersections of the gate input connection layer 33 and extension of the diffusion region 32 an N++type high impurity diffusion region 34 is formed to short-circuit those interrupted diffusion regions 32, 32. No FETs are formed on those unmarked intersections mentioned. The MOS FETs on the marked intersections are serially connected to each other along a direction in which the diffusion region 32 is arranged. N-channel MOS FETs for discharge control and NAND logic sections are formed by the MOS FETs. The drains of precharging P-channel MOS FETs 34 and 35 are connected as load means to the ends of the NAND logic sections. The sources of the MOS FETs 34 and 35 are connected to a voltage Vdd application point and a clock pulse $\phi$ is supplied to the gate. The input terminals of inverters 36 and 37 for waveform shaping are connected to the respective ends of the NAND logic sections. The outputs of inverters 36 and 37 are transmitted to the upper section of the FIG. 5 circuit, respectively, through the diffusion regions or connection layers 38 and 39. And the outputs of inverters 36 and 37 are transmitted to the other terminals of the NAND logic section by aluminium connection layers 43 and 44 which are connected through contact hole 40 and 41 and which traverse the gate input connection layer 33 through an insulating layer 42 on the substrate 31. FIG. 7 shows an equivalent circuit of the FIG. 5 circuit. In the circuit arrangement, no contact holes need to be provided at the positions where the MOS FETs are formed and, when the output of the inverters 36 and 37 are to be transmitted to another circuit, they can be supplied across the gate input connection layer 33 without being detoured, permitting reduction in the length of the interconnection layer as well as in the area of the interconnection layer. This enables a smaller sized chip with higher operation speed to be used.

Figure 4:
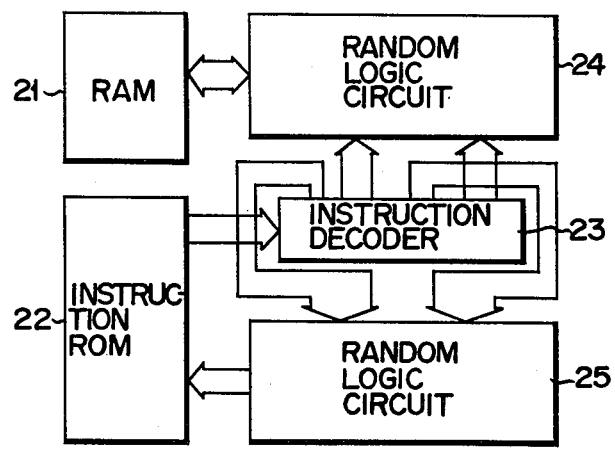
FIG. 4 is a block diagram of a one-chip microcomputer of the prior art adopting to instruction decoder of FIG. 2 which includes a circuit section of a pattern configuration as shown in FIG. 3.
Figure 8:
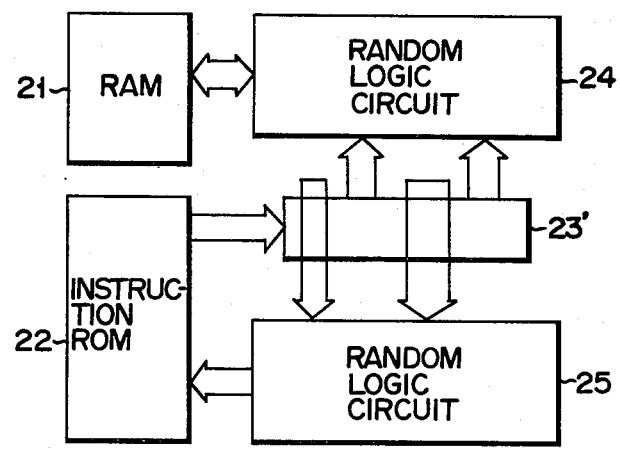
FIG. 8 is a block diagram showing an integrated circuit having a multi-layer interconnection layer according to another embodiment of this invention.

FIG. 8 is a block diagram showing a one-chip microcomputer using the instruction decoder as shown in FIG. 5. In this Figure, the same reference numerals are employed to designate parts or elements as shown in FIG. 4 and further explanation is omitted. As evident from FIG. 8, if an output from one side of an instruction decoder 23' is applied to a random logic circuit 25 located adjacent to the other side of the instruction decoder 23', it can be supplied across the instruction decoder 23', permitting a greater reduction in the area of the interconnection layer as well as in the length of the interconnection layer. This can shorten the signal delay time and enable a high operation speed to be attained.

What we claim is:

1. An integrated circuit having a multi-layer interconnection structure comprising:
   a logic section of series-connected MOS FETs each having a gate connection layer made of a polysilicon layer on a semiconductor substrate of a first conductivity type and source and drain semiconductor regions of a second conductivity type which are formed in the surface of said semiconductor substrate along such a direction as to traverse the gate connection layer;
   load means connected to one end of said logic section; and
   interconnection means for causing a signal at the junction of said load means and said logic section to be transmitted to the other end of said logic section across said gate input connection layer.

2. An integrated circuit having a multi-layer interconnection structure comprising:
   a read only memory (ROM) for storing instructions;

a logic section of series-connected MOS FETs each having a gate input connection layer made of a polysilicon layer on a semiconductor substrate of a first conductivity type and source and drain semiconductor regions of a second conductivity type which are formed in the surface of said semiconductor substrate along such a direction as to traverse the gate input connection layer;

load means connected to one end of said logic section;

an instruction decoder arranged adjacent to said ROM and including interconnection means for causing a signal at the junction of said load means and said logic section to be transmitted to the other end of said logic section across said gate input connection layer; and a pair of random logic circuits each arranged at, and adjacent to, a corresponding side surface of said instruction decoder and to which an output from said instruction decoder is applied.

3. An integrated circuit having a multi-layer interconnection structure according to claim 1, in which said load means is a metal oxide semiconductor field effect transistor for precharging.

* * * * *